United States Patent
Cordero et al.

(10) Patent No.: US 12,208,972 B2
(45) Date of Patent: Jan. 28, 2025

(54) DEVICE FOR CONVEYING A SHEET OF SUBSTRATE

(71) Applicant: SAINT-GOBAIN GLASS FRANCE, Courbevoie (FR)

(72) Inventors: Nicolas Cordero, Paris (FR); Xavier Brajer, Cormielles en Parisis (FR); Paul Mogensen, Chantilly (FR)

(73) Assignee: SAINT-GOBAIN GLASS FRANCE, Courbevoie (FR)

( * ) Notice: Subject to any disclaimer, the term of this patent is extended or adjusted under 35 U.S.C. 154(b) by 466 days.

(21) Appl. No.: 17/625,965

(22) PCT Filed: Jul. 17, 2020

(86) PCT No.: PCT/EP2020/070362
§ 371 (c)(1),
(2) Date: Jan. 10, 2022

(87) PCT Pub. No.: WO2021/013754
PCT Pub. Date: Jan. 28, 2021

(65) Prior Publication Data
US 2022/0242682 A1    Aug. 4, 2022

(30) Foreign Application Priority Data

Jul. 19, 2019  (EP) .................................. 19305962

(51) Int. Cl.
*B65G 49/06*        (2006.01)
*B65G 13/06*        (2006.01)
(Continued)

(52) U.S. Cl.
CPC ......... *B65G 49/063* (2013.01); *B65G 13/065* (2013.01); *B65G 13/12* (2013.01);
(Continued)

(58) Field of Classification Search
CPC .... B65G 49/063; B65G 13/065; B65G 13/12; B65G 21/2072; B65G 39/02; B65G 39/18;
(Continued)

(56) References Cited

U.S. PATENT DOCUMENTS 4,890,714 A * 1/1990 Brown .................. B65G 13/11
 193/35 J
5,288,553 A * 2/1994 Collins .................... D01F 6/62
 428/397
(Continued)

FOREIGN PATENT DOCUMENTS

DE    DE 33 45 940 A1    6/1985
EP    2 123 581 A1    11/2009
KR    2011063016 A *   6/2011 ............. B65G 13/06

OTHER PUBLICATIONS

Machine translation of KR-2011063016-A (Year: 2024).*
(Continued)

*Primary Examiner* — Mark A Deuble
(74) *Attorney, Agent, or Firm* — Pillsbury Winthrop Shaw Pitman LLP (57) ABSTRACT

A device for conveying a sheet of substrate having two opposed main faces linked b y an edge face, wherein one of the main faces of the sheet of substrate is positioned along a reception plane of the device, the reception plane being close to a vertical plane, including a plurality of lower rollers positioned side by side along a conveying direction, each of them being able to rotate about a lower rotation axis extending perpendicularly to the conveying direction in a conveying plane and being arranged to receive a part of the edge face of the sheet of substrate, a plurality of upper rollers, each of them being arranged to receive one of said main (Continued)

faces of the sheet of substrate and being able to rotate about an upper rotation axis orthogonal to the conveying direction.

25 Claims, 8 Drawing Sheets

(51) Int. Cl.
    *B65G 13/12*     (2006.01)
    *B65G 21/20*     (2006.01)
    *B65G 39/02*     (2006.01)
    *B65G 39/18*     (2006.01)
    *C23C 14/34*     (2006.01)
    *C23C 14/50*     (2006.01)

(52) U.S. Cl.
    CPC .......... *B65G 21/2072* (2013.01); *B65G 39/02* (2013.01); *B65G 39/18* (2013.01); *C23C 14/34* (2013.01); *C23C 14/50* (2013.01)

(58) Field of Classification Search
    CPC ...... B65G 13/06; B65G 47/22; B65G 49/064; B65G 2201/022; C23C 14/34; C23C 14/50; H01L 21/67706; H01L 21/67712
    See application file for complete search history.

(56) References Cited

U.S. PATENT DOCUMENTS 9,165,809 B2 * 10/2015 Bae ................... B65G 21/2072
11,721,568 B2 * 8/2023 Jang ................. H01L 21/67259
                                                                                   198/626.1
2006/0035021 A1    2/2006 Hartig

OTHER PUBLICATIONS

Translation of DE 33 45 940 (Year: 2024).*
International Search Report as issued in International Patent Application No. PCT/EP2020/070362, dated Sep. 3, 2020.

* cited by examiner

DEVICE FOR CONVEYING A SHEET OF SUBSTRATE

CROSS-REFERENCE TO RELATED APPLICATIONS

This application is the U.S. National Stage of PCT/EP2020/070362, filed Jul. 17, 2020, which in turn claims priority to European patent application number 19305962.3 filed Jul. 19, 2019. The content of these applications are incorporated herein by reference in their entireties.

TECHNICAL FIELD OF THE INVENTION

The invention relates to a device for conveying a substrate.

More precisely, the invention relates to a device for conveying a sheet of substrate having two opposed main faces linked by an edge face, wherein one of said main faces of the sheet of substrate is positioned along a reception plane of said device, said reception plane being close to a vertical plane, comprising:
- a plurality of lower rollers positioned side by side along a conveying direction, each of them being able to rotate about a lower rotation axis extending perpendicularly to the conveying direction in a conveying plane and being arranged to receive a part of the edge face of the sheet of substrate,
- a plurality of upper rollers, each of them being arranged to receive one of said main faces of the sheet of substrate and being able to rotate about an upper rotation axis orthogonal to said conveying direction.

It also relates to associated methods for conveying a sheet of substrate, to an associated computer program product, and an associated non-transitory computer-readable medium comprising such a computer program product.

BACKGROUND INFORMATION AND PRIOR ART

Different devices and methods for conveying sheets of substrates such as sheets of glass in a configuration where their main faces are close to vertical are known. They are used for example to convey the sheets of substrate while they are being processed, for example coated, while avoiding any debris or more generally any unwanted substance falling onto the coated main faces.

Moreover, in industrial processes, conveying sheets of substrate in a configuration where the main faces are close to vertical also allows reducing the overall ground extent of the device.

Ensuring the stability of the sheet of substrate lying on its edge face in such a close to vertical position is challenging, as large deformations may occur, due to buckling or sagging, and lead to the fall and breakage of the sheet of substrate and/or to incompatibilities with production lines and processes. This is particularly true for thinner and/or large sheets of substrate which buckle and sag more easily under their own weight.

In addition to these static deformations, stability can also be affected by vibrations linked to accelerations, displacements and conveyor imperfections, to thermal loads generated during industrial processes, for example during vacuum sputtered thin films depositions, and to residual stresses. Indeed, going from one roller to the other can generate unwanted displacements if the rollers are not perfectly aligned or if the sheet of substrate is not perfectly flat anymore due to its thermo-mechanical deformations.

In known devices for conveying sheets of substrate, also called in the following "conveyors", the edge of each sheet of substrate is received on lower rollers aligned along the conveying direction and one the main face of the sheet of substrate is received by a single row of upper rollers all placed at the same height relative to the lower rollers.

In these known conveyors, the stability of each sheet is ensured by encasing the periphery of each transported sheet of substrate in a rigid frame. This also allows limiting the effect of thermo-mechanical deformations of the sheet of substrate during conveying.

Additionally, the periphery of the sheet of substrate is then protected, as it is not directly in contact with the conveyor. This can prevent damages caused by metal/substrate contacts.

However, encasing the periphery of each sheet of substrate in such a frame and freeing each sheet from the frame at the end of the process add complex and time-consuming steps to the conveying of the sheet of substrate.

SUMMARY OF THE INVENTION

Therefore one object of the invention is to provide a new device for conveying a sheet of substrate without having to mount any accessory such as a frame on said sheet of substrate for conveying it, while ensuring its stability and limiting the effect of thermo-mechanical deformation of the sheet of substrate during conveying.

The above objects are achieved according to the invention by providing a device as described above, wherein said plurality of upper rollers comprises upper rollers positioned at different heights from said conveying plane.

Thanks to this new feature of the device for conveying the sheets of substrate, it is possible to better stabilize the sheet of substrate while it is being conveyed. Moreover, it is even possible, as described hereafter, to limit or compensate at least part of the thermo-mechanical deformation occurring during conveying and processing the sheet of substrate.

Other advantageous and non-limiting features of the device according to the invention are listed in claims 1 to 14.

The invention also relates to a method for conveying a sheet of substrate, using a device for conveying a sheet of substrate as describe above, wherein the position of each upper rotation axis is moved away from the reception plane of the sheet of substrate when said sheet of substrate first arrives close to contacting the lateral surface of revolution of the upper rollers supported by this upper rotation axis.

Thanks to this specific way of using the device according to the invention, it is possible to avoid one of the effects of the thermo-mechanical deformation of the sheet of substrate. Indeed, the deformation of the leading edge of the sheet of substrate, that is to say, of the vertical edge first entering the device for conveying the sheet of substrate, may cause this leading edge to collide with the upper rollers. By moving the upper rollers backwards, away from the sheet of substrate, when the leading edge arrives close to the upper rollers, before contacting it, collision is avoided.

The invention also relates to a method for conveying a sheet of substrate using a device as described above, wherein the position of each lower roller along its lower rotation axis and/or the position of each upper rotation axis relative to the reception plane is adjusted in real time to limit deformation of the sheet of substrate located near the edge of the sheet of substrate first conveyed in said device and/or to limit deformation of the sheet of substrate linked to thermal or mechanical stress applied to the sheet of substrate while it is being conveyed.

Thanks to this specific way of using the device according to the invention, it is possible to limit and/or at least partially compensate expected thermo-mechanical deformations of the sheet of substrate. Indeed, by adjusting the positions of the upper and/or lower rollers, voluntary controlled deformations may be applied to the sheet of substrate in order to achieve a final controlled shape of the sheet of substrate where deformations of the whole sheet or of specific parts of the sheet of substrate are avoided or limited.

The invention also relates to a deposition system implementing a device as described above, the deposition system being adapted for depositing an electrochromic stack on the sheet of substrate.

In this description, an "electrochromic stack" refers to a stack comprising a first transparent conductive layer, an electrochromic layer, a counter electrode layer and an ion conducting layer that separates the electrochromic layer and the counter electrode layer.

Typically, the deposition systems implement multiple stations, each dedicated to a particular unit operation such as depositing a particular component (or portion of a component) of an electrochromic stack.

In this sense, the invention also relates to a method of depositing an electrochromic stack, which implements the deposition system described above. It should be understood that while the order of deposition operations is traditionally first the electrochromic layer, second the conductive layer, and finally the counter-electrode layer, the order can be reversed in various embodiments.

The invention also relates to a computer program product, comprising program code instructions for implementing any of the methods described above, when said program is executed on a computer or a processor.

The invention also relates to a non-transitory computer-readable medium comprising a computer program product recorded thereon and capable of being run by a processor, including program code instructions for implementing any of the methods described above.

DETAILED DESCRIPTION OF EXAMPLE(S)

The following description with reference to the accompanying drawings will make it clear what the invention consists of and how it can be achieved. The invention is not limited to the embodiment/s illustrated in the drawings. Accordingly, it should be understood that where features mentioned in the claims are followed by reference signs, such signs are included solely for the purpose of enhancing the intelligibility of the claims and are in no way limiting on the scope of the claims.

In the accompanying drawings.

In the following description, corresponding similar or identical elements of the figures will be referenced by the same symbols and will not be described in all details for each figure.

The vertical direction is here the direction of a plumb line. A horizontal plane is orthogonal to this vertical direction.

The wordings top/bottom, up/down are defined by reference to the vertical direction and to the orientation of the elements described during their use.

The context of the invention is here the transport of close-to-vertical thin sheets of substrate for industrial processes such as vacuum sputtered thin films.

The wording "thin" is used here as meaning that the thickness of the sheet of substrate is smaller than its other dimensions, for example at least 100 times smaller, or at least 1000 times smaller. In other words, the thickness of the sheet of substrate is less than a hundredth or less than a thousandth of the other dimensions of the sheet of substrate.

Such thin sheet of substrate may be for example a thin glass sheet having at least a size of 1.5 by 1.0 meters, preferentially a size of at least 3.2 by 1.85 meters, more preferentially a standard size of 6 by 3.2 meters, with various thickness ranging from 1 to 10 millimeters, preferentially from 1 to 3 millimeters, preferentially from 1.5 to 2.6 millimeters, more preferentially from 1.9 to 2.3 millimeters.

However, the embodiments of the device and methods of the invention are not limited to these applications. Other types of substrate may be considered, as well as other dimensions and/or thickness. The device and methods may be used while implementing other coating methods or other types of processes of the sheet of substrate.

Figure 3:
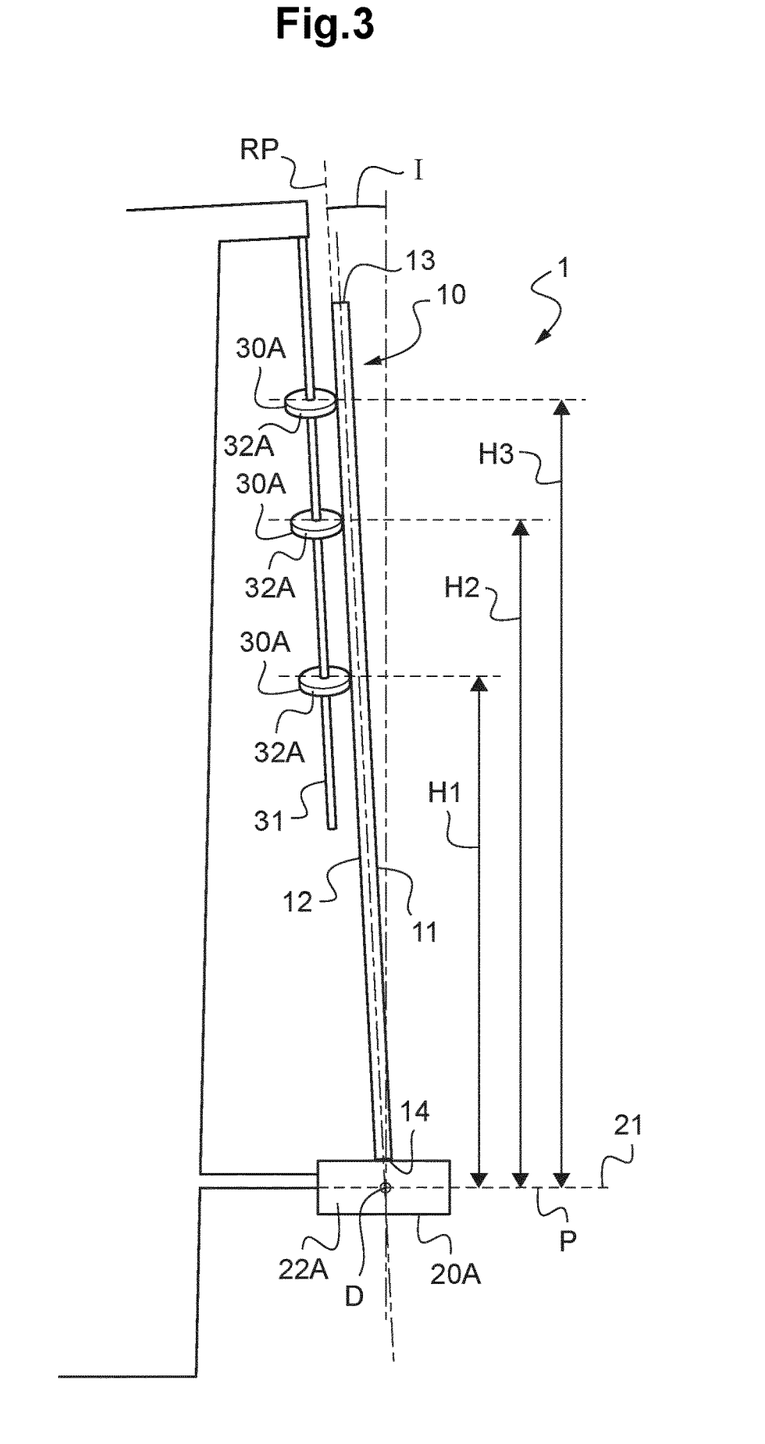
FIG. 3 is a schematic profile view of part of an embodiment of the device for conveying a sheet of substrate with a sheet of substrate.
Figure 4:
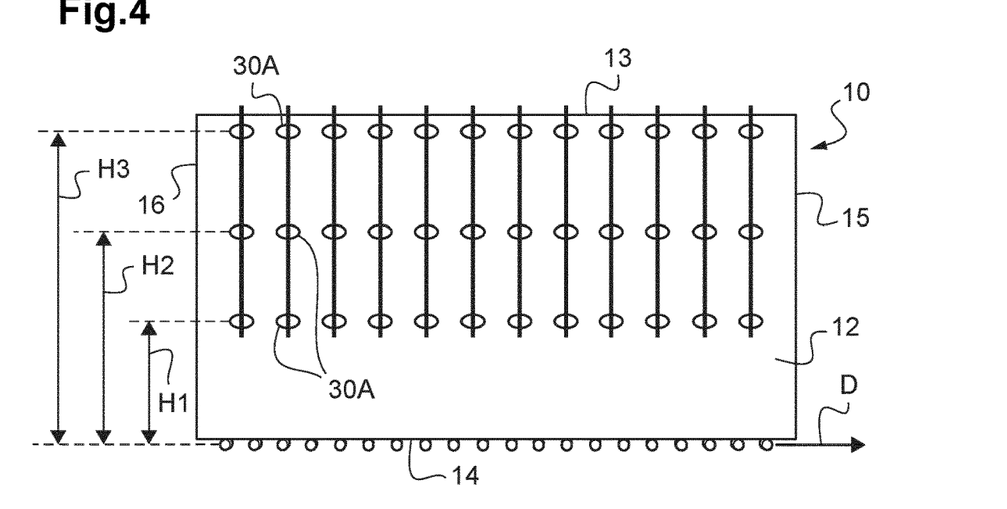
FIG. 4 is a schematic back view of the embodiment of the device for conveying a sheet of substrate of FIG. 3.
Figure 17:
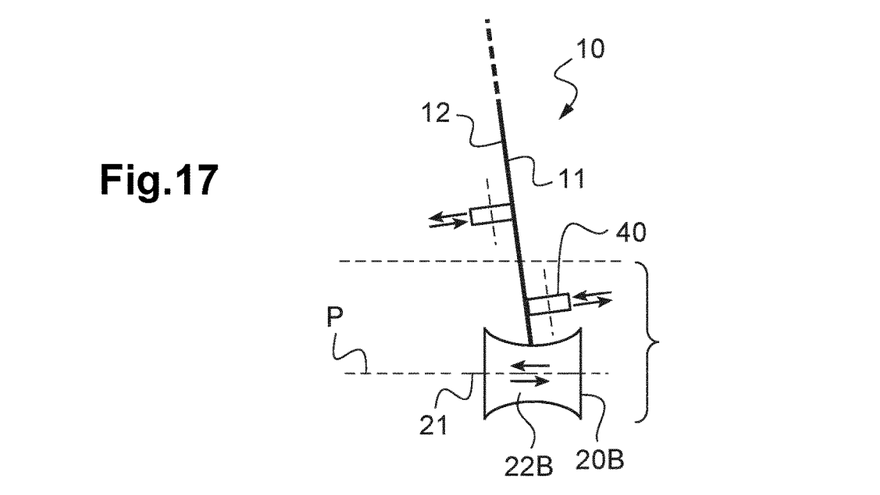
FIG. 17 is a schematic profile view of part of the conveying device of FIG. 16.

As represented on FIGS. 3, 4 and 17, the sheet of substrate 10 typically has two opposed main faces 11, 12 linked by an edge face. As the sheet of substrate is generally quadrangular, here rectangular, the edge face comprises four parts, among which a bottom edge 14, an top edge 13, a leading edge 15 and a closing edge 16. The main face 12 oriented towards the upper rollers will be named hereafter the back face 12, whereas the opposed main face 12 will be named the front face 11.

In the device 1 according to the invention, one of said main faces 11, 12 of the sheet of substrate 10 is positioned along a reception plane RP of said device 1, said reception plane being close to a vertical plane. Conventionally, in the following it is considered that the back face 12 is received in the reception plane RP.

In practice, the reception plane RP of the sheet of substrate 10 is as close as being vertical as possible. For stability reasons, it is not currently possible to have a perfectly vertical reception plane. Therefore, the reception plane RP is for example inclined by 2 to 3 degrees relative to the vertical direction. The inclination angle I of the reception plane relative to the vertical direction is preferably comprised between 1 and 15 degrees, preferably between 1 and 7 degrees, preferably between 1 and 5 degrees and even preferably between 1 and 3 degrees (FIG. 3).

The reception plane RP is a theoretical plane corresponding to the plane where the back face 12 is received when the sheet of substrate 10 is not subject to any deformation.

The conveying device 1 according to the invention comprises a plurality of lower rollers 20A; 20B positioned side by side along a conveying direction D (FIGS. 3, 7-9, 16), each of them being able to rotate about a lower rotation axis 21 (FIGS. 3 and 16) extending perpendicularly to the conveying direction D in a conveying plane P and being arranged to receive a part of the edge face of the sheet of substrate 10.

In practice, the lower rollers 20A; 20B are configured to receive the bottom edge 14 of the sheet of substrate 10.

The conveying direction D corresponds to the global direction along which the sheet of substrate 10 is conveyed. It may be defined as the direction of the straight line going through the initial first zone of contact between the lower rollers 20A; 20B and the leading edge 15 of the sheet of substrate 10 when it enters the conveying device 1 and the last zone of contact between the lower rollers 20A; 20B and this leading edge 15 of the sheet of substrate 10 when it exits the conveying device 1.

The conveying device 1 also comprises a plurality of upper rollers 30A; 30B, each of them being arranged to receive one of said main faces 11, 12 of the sheet of substrate 10 and being able to rotate about an upper rotation axis 31 orthogonal to said conveying direction D (FIG. 3).

Each of the lower roller 20A; 20B and upper roller 30A; 30B comprises a receiving portion adapted to receive a face of the sheet of substrate and a mounting portion adapted to rotatably mount the receiving portion on the lower or upper rotation axis 21, 31.

The receiving portion comprises a lateral surface 22A, 32A; 22B, 32B having a transverse sections (orthogonal to its rotation axis) of circular shape, configured to remain in contact with the corresponding face of the sheet of substrate during conveying. The lateral surface 22A, 32A; 22B, 32B may have any adapted shape such as cylindrical, frustoconical, toroidal or spherical. It may also be a more complex shape as long as it is a surface of revolution.

Figure 14:
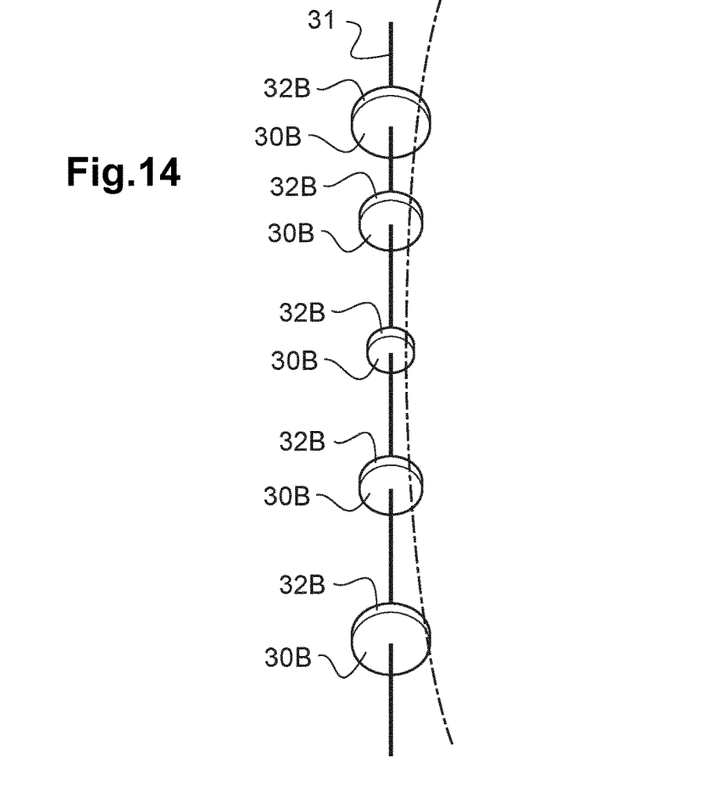
FIG. 14 is a schematic view of one of the upper rotation axis of an embodiment of the device according to the invention, wherein the diameters of the upper rollers mounted of this upper rotation axis are different, thereby imposing a curved profile to the sheet of substrate relying on these upper rollers, schematically represented by a dash-dotted line.

In the embodiments shown on FIGS. 3 and 14, the lateral surface 22A, 32A; 22B; 32B of each of the lower and upper rollers 20A, 30A; 20B, 30B is cylindrical.

Figure 15:
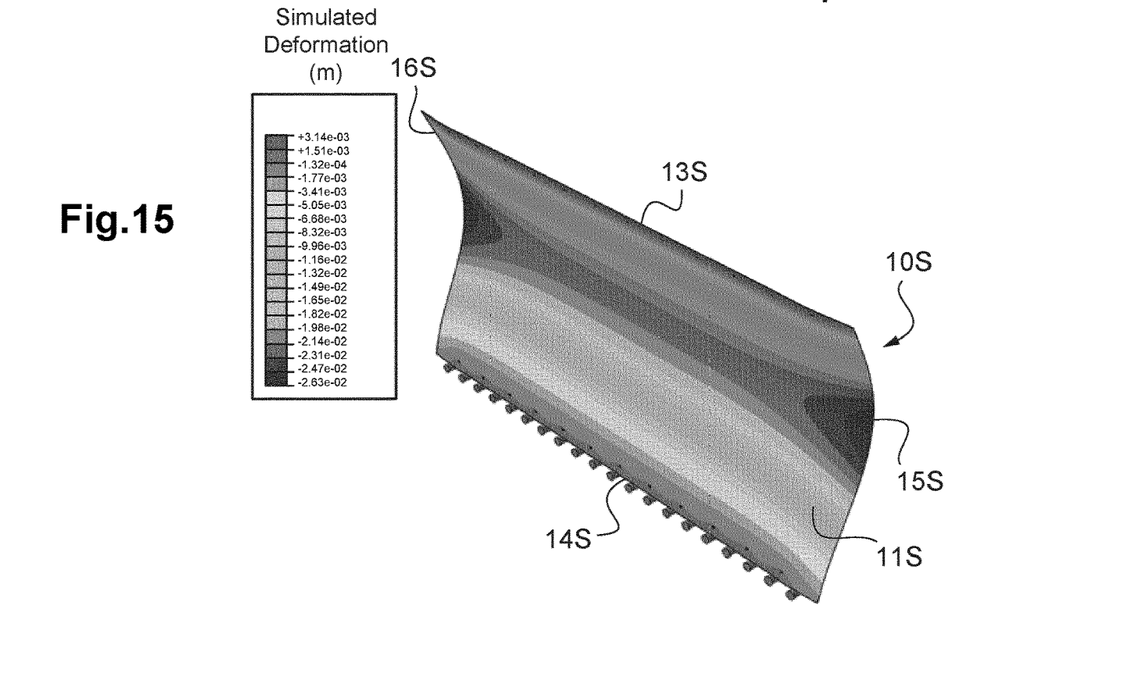
FIG. 15 is a contour map showing simulated amplitude levels (scale in meters) of the bending of a sheet of glass 6 meters long, 3.2 meters high and 2.1 millimeters thick, placed in an embodiment of the conveying device according to the invention, comprising here five rows of twelve upper rollers parallel to the conveying direction, corresponding to twelve upper rotation axes similar to the one of FIG. 14.

FIGS. 14 and 15 show an embodiment where the lateral surface 22B of each lower roller 20B is a surface of revolution generated by a curved, concave meridian. The lower rollers 20B may for example have a bi-conical shape or hourglass shape.

Typically, the mounting portions of the lower and upper rollers are made of metal. The receiving portion is made of a material appropriate to the industrial process considered, for example, of a material adapted to be placed in a vacuum chamber. It can be for example made of metal or any elastic material.

During conveying, the sheet of substrate 10 may be subject to different kind of deformations caused by mechanical an/or thermal stresses.

It may be subject to deformations due to gravity, linked to its own weight and its inclination relative to the vertical direction.

It may also be subject to deformations due to its transport in the conveying device, resulting from vibrations and/or misalignment of the lower and/or upper rollers and/or irregularities of the surfaces of the lower or upper rollers in contact with the sheet of substrate.

These deformations are mechanical deformations, due to the conveying of the sheet of substrate itself.

Other types of deformations may be linked to the processing of the sheet of substrate performed while it is being conveyed.

For example, the process performed may cause variations of the temperature of some parts of the sheet of substrate, thereby causing thermal deformations of the sheet of substrate.

In a remarkable manner, in the device 1 according to the invention said plurality of upper rollers 30A; 30B comprises upper rollers positioned at different heights H1, H2, H3 from said conveying plane P (FIG. 3).

Such plurality of upper rollers 30A; 30B then provide lateral surfaces 32A; 32B in contact with the back face 12 of the sheet of substrate 10 at places situated at least 10 centimeters away from each other along the vertical direction.

Preferably, upper rollers 30A; 30B located at at least three different heights, preferably four different heights, even preferably five or six different heights are used.

The embodiment represented on FIGS. 3 and 4 is an example of the device 1 according to the invention where three rows of upper rollers are used. Each row comprises upper rollers 30A mounted at the same height H1, H2, H3 relative to the lower rollers on twelve upper rotation axes 31.

These values are especially useful when dealing with the sheets of glass of standard size mentioned above. They should be adapted to the size of the sheet of substrate actually considered.

Preferably, the upper rollers are regularly distributed along the vertical direction of the sheet of substrate. The gap between the different heights of the upper roller is advantageously the same. However, other distributions may be considered.

In order to provide stability to the sheet of substrate 10 all along its transport by the conveying device 1, it is advantageous to provide a similar distribution of upper rollers 30A; 30B along the conveying direction D.

In practice, the plurality of upper rotation axes 31 comprises a predetermined number of upper rotation axes 31 regularly spaced in order for the sheet of substrate to remain in contact with a predetermined number of upper rollers 30A; 30B at all time during conveying.

In the examples described here, upper rotation axes 31 are spaced by about 46 centimeters, so that the back face 12 of the sheet of substrate 10 is in contact with the upper rollers mounted on twelve upper rotation axes 31 at all time (FIG. 4).

In practice, at least one of said upper rotation axis 31 supports at least two upper rollers 30A; 30B.

Preferably, each upper rotation axis 31 supports at least two upper rollers 30A; 30B.

In the examples described here, in order to achieve a satisfactory stability of the sheet of substrate, each upper rotation axis 31 supports a plurality of upper rollers 30A; 30B located at the same heights relative to the lower roller 20A; 20B.

In this configuration, the upper rollers 30A; 30B supported by different upper rotation axes 31 at the same height form a row of upper roller 30A; 30B parallel to the conveying plane P.

FIGS. 3 and 4 show the case of an embodiment with three rows of upper rollers 30A, whereas FIG. 14 shows the case of an embodiment with five rows of upper rollers 30B.

In the embodiment of FIGS. 3 and 4, all the upper rollers 30A are identical: rigid, cylindrical, with a diameter of 50 millimeters and a height of 20 millimeters.

As shown in FIG. 3, in this embodiment, the upper rotation axis 31 extend parallel to the reception plane P, therefore parallel to the back face 12 of the sheet of substrate 10 with no deformation.

In the embodiment of FIG. 14, the upper rollers 30B are rigid, cylindrical, with a height of 20 millimeters and different diameters as described in more details hereafter.

In the case where, as illustrated for example by FIG. 14 and described later, the upper rollers 30B of each row of upper rollers 30B do not have the same diameter, it can be considered that the upper rotation axes 31 are not parallel to the sheet of substrate without deformation, as long as the contact areas of the lateral surfaces of the upper rollers 30B with the back face 12 of the sheet of substrate 10 remains in the reception plane RP.

Moreover, in the embodiments shown here, each upper rotation axis supports the same number of upper rollers. Alternatively, upper rotation axes may support different numbers of upper rollers.

In the following, the results of different simulations are presented.

In these simulations, bending or deformation of the sheet of glass is defined as the difference between maximum and minimum out-of-plane displacements of simulated sheets of substrate.

The simulated sheet of substrate is a simulated sheet of glass 10S inclined of 3 degrees relative to the vertical direction, and received by different numbers of rows of upper rollers supported by twelve upper rotation axes. The upper rollers all have a diameter of 50 millimeters and a height of 20 millimeters.

These simulations are used as a way to evaluate and compare considered cases.

All the simulation were calculated in a configuration where both simulated leading and closing edges 15S, 16S are not supported by upper rollers, as if they were just leaving the upper rollers located on a last upper rotation axis and about to contact the upper rollers located on the next upper rotation axis.

In practice this configuration does not happen but it allows to evaluate in a worst case scenario how the sheet will "fall" or "jump" when going from the upper rollers of one upper rotation axis to another.

Figure 1:
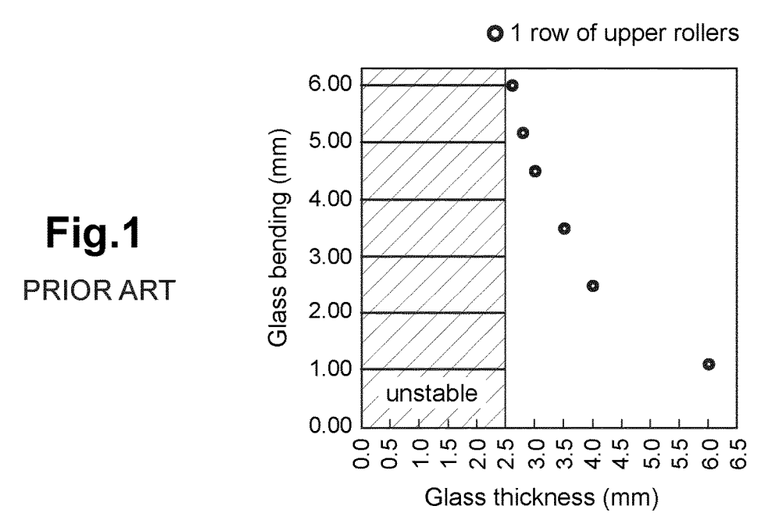
FIG. 1 is a graph showing simulated amplitude in millimeter of the bending of a sheet of glass 6 meters long, 3.2 meters high placed in a conveying device according to the prior art, that is to say, comprising only one row of upper rollers parallel to the conveying direction, as a function of the thickness of the sheet of glass in millimeters.

FIG. 1 shows the result of a static finite-element simulation of the bending of a standard-size simulated glass sheet of different thickness conveyed in a state-of-the-art conveying device comprising only one row of upper rollers to receive the back face of the sheet of glass, without adding an additional frame to stabilize and protect the sheet of glass.

The single row of upper rollers comprises twelve upper rollers placed at 2.1 meters from the lower rollers.

Simulations of glass deformation show that sheets thinner than 2.6 millimeters deform too much to be safely transported on the state-of-the-art device. Deformations of more than 6 millimeters lead to buckling of the sheet of glass.

Figure 2:
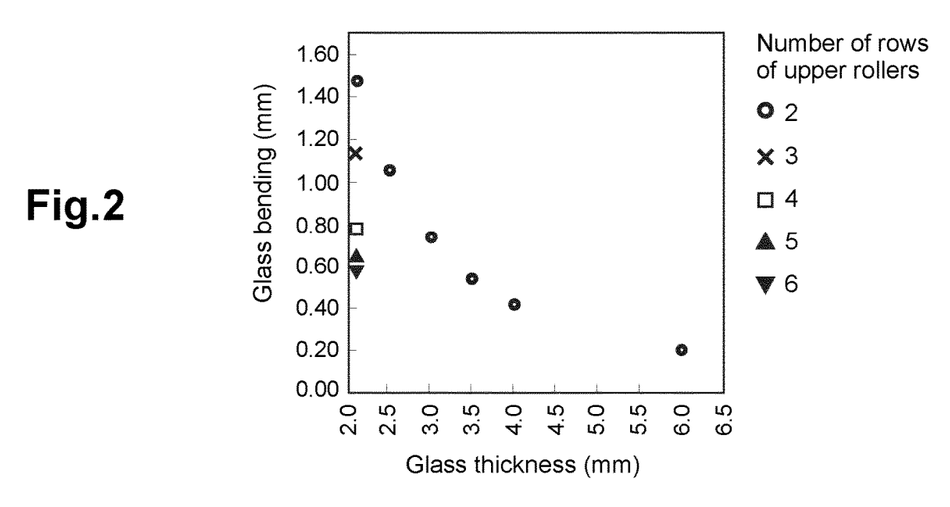
FIG. 2 is a graph showing simulated amplitude in millimeter of the bending of a sheet of glass 6 meters long, 3.2 meters high placed in different embodiments of the conveying device according to the invention, comprising here two rows (round symbols), three rows (cross symbols), four rows (square symbols), five rows (up triangle symbols) or six rows (down triangle symbols) of upper rollers parallel to the conveying direction, as a function of the thickness of the sheet of glass in millimeters.

FIG. 2 shows a similar simulation achieved with the features of different embodiments of the device according to the invention.

The features of these embodiments are described in the following table 1.

TABLE 1

| Number of rows of upper rollers | Total number of upper rollers | Top row height relative to the lower rollers in meters | Distance between adjacent rows in meters |
|---|---|---|---|
| 2 | 24 | 2.7 | 1.4 |
| 3 | 36 | 3.0 | 1.0 |
| 4 | 48 | 3.0 | 0.7 |
| 5 | 60 | 3.0 | 0.6 |
| 6 | 72 | 3.0 | 0.5 |

Results presented on FIG. 2 show that the amplitude of the bending of the sheet of glass is considerably reduced by adding a second row of upper rollers 30A, the maximum deformation for a sheet of glass of 2.6 millimeters being about 6 millimeters with only one row of upper rollers and 1.5 millimeter with two rows of upper rollers 30A.

At least two upper rollers rows are required to ensure the stability of sheets of glass thinner than 2.6 mm. Four or five rows of upper rollers are preferred.

Using more than 5 rows of upper rollers provides limited improvement.

Using at least two rows of upper rollers therefore allows conveying sheets of substrate of smaller thickness than with the state-of-the-art devices, without needing to frame them, which is quicker and simpler.

Moreover, the conveying device according to the invention may be further optimized.

It is for example possible to adjust a position of each upper roller 30A; 30B along the upper rotation axis 31 by which it is supported and/or a number of upper roller 30A; 30B supported by each upper rotation axis 31.

To this end, a further embodiment of the device according to the invention comprises upper rollers 30A; 30B whose position and/or number are adjustable.

More precisely, the mounting portion of each upper rollers 30A; 30B for example allows blocking and unblocking the upper roller 30A; 30B on the upper rotation axis 31 at an adjustable height on the upper rotation axis. In this way, each upper roller 30A; 30B may be mounted at different heights on the upper rotation axis 31. The upper rotation axis may for example comprise a rack. The mounting portion of the upper roller 30A; 30B may cooperate with the upper rotation axis 31 by clip-on or interlocking means. These means may be motorized so that the adjustment can be done in real time during conveying the sheet of substrate. It can also be done in a preparation step before conveying the sheet of substrate.

The adjustment may also be achieved manually. It is then done in a preparation step before conveying the sheet of substrate.

Thanks to the fact that each upper roller may be unblocked and moved along the upper rotation axis, it is also possible to add or remove one or several upper rollers from the upper rotation axis. This adjustment may be achieved manually or automated. It is preferably done in a preparation step before conveying the sheet of substrate.

In another embodiment of the device according to the invention, the position of the upper rollers 30A; 30B is adjustable in distance relative to the reception plane RP.

To this end, the upper rotation axis 31 is movable relative to the reception plane RP, backwards, that is away from the reception plane, or forward, towards the reception plane. The mobility of the upper rotation axis 31 may be motorized so that the adjustment can be done in real time during conveying the sheet of substrate. It can also be done in a preparation step before conveying the sheet of substrate.

The adjustment may also be achieved manually. It is then done in a preparation step before conveying the sheet of substrate.

The mobility of the upper rotation axis may also be a passive one. The upper rotation axis 31 may be mounted on thin blades that buckle and move backwards, away from the reception plane, when the sheet of substrate contacts the upper rollers, and then retrieve their initial shape, bringing the upper rotation axis back in its initial position.

Alternatively, in yet another embodiment each upper roller is configured to be able to move relative to the reception plane independently from the others.

Example of use of these adjustments will be given later.

According to yet another embodiment of the device according to the invention, the lateral surface of each upper roller 30A; 30B is adapted to be moved away from said reception plane RP. This can of course be achieved through the mobility of the whole upper rotation axis, as described before.

However, it can also be achieved by the use of upper rollers 30A; 30B with lateral surface adapted to be deformed away from said reception plane RP. The lateral surface 32A; 32B of each upper roller 30A; 30B is then moved away from the reception plane RP without moving the corresponding upper rotation axis 31.

To this end, upper rollers with a specific design or material are used. For example the lateral surface 32A; 32B of the upper rollers comprises a deformable material or a structure leading the lateral surface to buckle and move backwards when contacted.

Although the upper rollers with adjustable height and/or adjustable distance of the upper rotation axis and/or of their lateral surface to the reception plane have been here described in relation with the device 1 according to the present invention, comprising a plurality of rows of upper rollers, it is to be noted that these features of the device according to the invention could also be advantageously implemented in a conveying device having only one row of upper rollers.

As already mentioned, the upper rollers 30B supported by the same upper rotation axis may have different diameters, as represented on FIG. 14.

Preferably, the diameter of each upper roller 30B is determined taking into account an expected deformation of the sheet of substrate 10 while it is conveyed on the device 1.

Expected deformations of the sheet of substrate are either determined by simulation or actual measures performed on conveyed sheets of substrate.

The simulated or measured deformations are recorded in association with the features of the sheet of substrate (dimensions, material . . . ), the features of the device used (position/number/diameters of upper rollers . . . ) and the environmental conditions (thermal load . . . ).

More precisely, the diameter of each upper roller 30B is determined to limit deformation of the sheet of substrate located near the edge of the sheet of substrate first conveyed in said device 1 and/or to limit deformation of the sheet of substrate linked to thermal or mechanical stress applied to the sheet of substrate while it is being conveyed.

The determination of the diameter of each upper roller 30B may be for example based on simulated deformation of the sheet of substrate and on expected environmental conditions of the conveying device 1, such as working temperature.

Alternatively, the determination of the diameter of each upper roller 30B may take into account experimental data acquired while conveying similar sheet of substrate in similar environmental conditions, for example thanks to the use of sensors. These experimental data may comprise temperature and/or out-of-plane displacement measures at several locations on the sheet of substrate.

The experimental data and/or simulated data may be stored in a table or an abacus, in association with the appropriate settings of the device to be used.

The settings of the device comprise in particular the positions and/or number of upper rollers to be used.

Based on the expected deformation of the sheet of substrate, it is possible to determine the diameters of the upper roller in order to define a reception surface that exhibits a complex curved shape, not planar. The reception surface is then defined as the surface going through the zone of contact between each upper roller 30B and the back face 12 of the sheet of substrate 10. In the embodiment of FIG. 14, the reception surface profile corresponds to the sheet of substrate profile represented by a dash-dotted line. This reception surface being curved, it causes predetermined, controlled deformation to the sheet of substrate 10 received by the upper roller 30B.

The diameters of the upper rollers 30B are then determined in order to obtain a reception surface causing controlled deformations that will either limit or compensate the deformations expected to occur while the sheet of substrate is being conveyed.

As an example, detailed hereafter, imposing a controlled transverse deformation, along the close-to-vertical direction of the closing edge 16 and leading edge 15 of the sheet of substrate 10 will rigidify the sheet of substrate longitudinally, in the conveying direction D, and therefore limit longitudinal deformations.

In a further embodiment of the device 1 according to the invention, the upper rollers 30B supported by different upper rotation axes may also have different diameters. This allows imposing a controlled longitudinal deformation of the sheet of substrate 10. This will rigidify the sheet of substrate along the transverse close-to-vertical direction and therefore limit deformation along this transverse direction.

The diameters of the upper rollers 30B supported by different upper rotation axes 31 are then determined to limit deformation of the sheet of substrate located near the edge of the sheet of substrate first conveyed in said device 1 and/or to limit deformation of the sheet of substrate linked to thermal or mechanical stress applied to the sheet of substrate while it is being conveyed.

Although the upper rollers with different diameters on different upper rotation axes have been here described in relation with the device according to the present invention, comprising a plurality of rows of upper rollers, it is to be noted that this feature of the device according to the invention could also be advantageously implemented in a conveying device 1 having only one row of upper rollers.

In a further embodiment of the device 1 according to the invention, the lateral surface 22B of each lower roller 20B presents a concave shape and is movable along its lower rotation axis 21. Such an embodiment is schematically shown on FIGS. 16 and 17.

Figure 16:
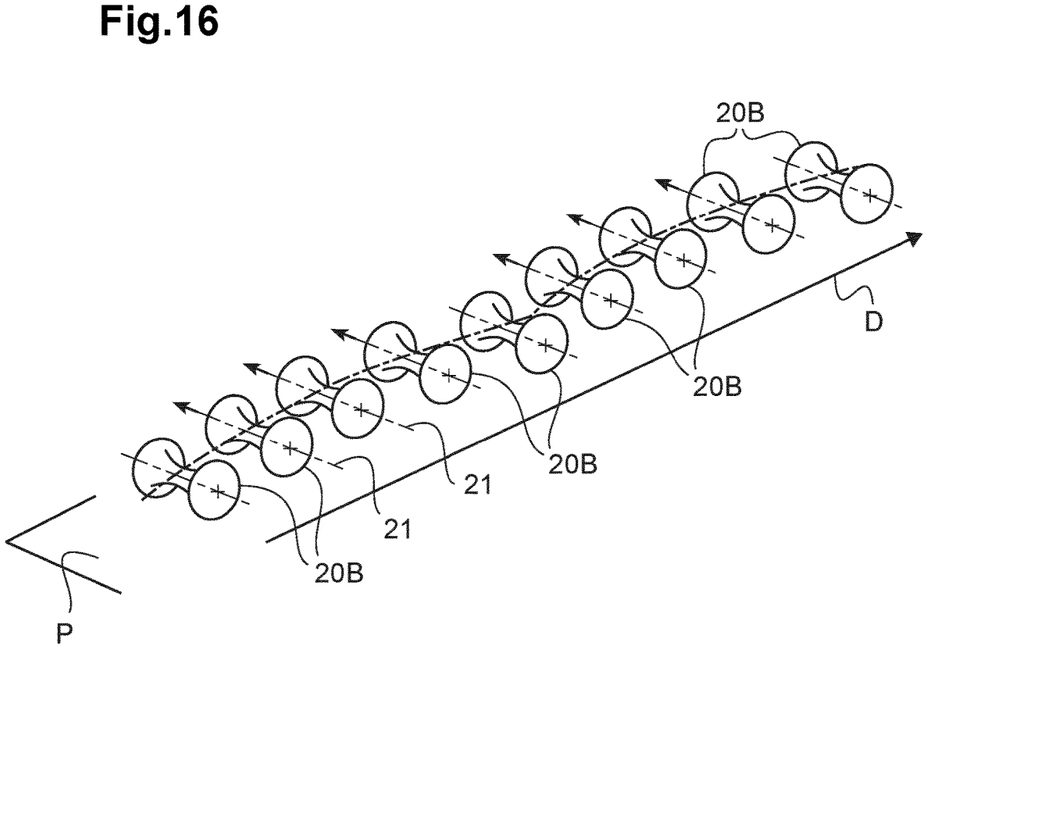
FIG. 16 is a schematic perspective view of the lower rollers of an embodiment of the conveying device according to the invention, with a bottom edge of the sheet of substrate schematically represented by a dash-dotted line.

Thanks to this specific shape of the lower rollers 20B, the sheet of substrate 10 may be continuously deformed along the conveying direction D.

In practice, while the lower roller 20B is moved along its lower rotation axis 21, that is, along a direction perpendicular to the conveying direction D, the lower edge 14 of the sheet of substrate 10 remains at the bottom of the concave lateral surface 22B. Consequently, while the lower roller 20B is moved along its lower rotation axis 21, the bottom edge 14 of the sheet of substrate 10 follows this movement.

Adjusting the position of the lower roller 20B along its lower rotation axis 21 then allows imposing a controlled longitudinal deformation of the sheet of substrate 10. This will rigidify the sheet of substrate along the transverse close-to-vertical direction and therefore limit deformation along this transverse direction.

The position of the lower roller 20B along its lower rotation axis 21 is then determined to limit deformation of the sheet of substrate located near the edge of the sheet of substrate first conveyed in said device and/or to limit deformation of the sheet of substrate linked to thermal or mechanical stress applied to the sheet of substrate while it is being conveyed.

This feature of the device according to the invention could also be advantageously implemented in a conveying device having only one row of upper rollers.

Alternatively, it is possible to consider imposing a longitudinal curvature to the sheet of substrate with continuous and synchronized displacements of upper rotation axes towards the reception plane or away from the reception plane, this displacement being applied successively to the upper rotation axes as the sheet of substrate is conveyed along the conveying direction.

In another embodiment of the device 1 according to the invention, additional opposed upper rollers 40 are positioned to contact the other main face 11 of the sheet of substrate 10, that is, here, the front face 11 of the sheet of substrate 10.

These additional opposed upper rollers 40 allow better controlling the deformation of the sheet of substrate 10 caused by adjusting the positions of the lower rollers. In the embodiment described here, they are placed close to the bottom edge 14 of the sheet of substrate 10, so that they are located behind the commonly installed shield preventing sputtering materials on the conveying device.

The position, height and distance to the front face 11, of the additional opposed upper rollers 40 are advantageously adjustable.

They are adjusted depending on the sheet of substrate thickness and expected deformation of the sheet of substrate.

These positions are preferably kept during the process. A more complex active control of the position of these additional upper rollers 40 can also be implemented and provide optimized settings without production interruption.

This feature of the device according to the invention could also be advantageously implemented in a conveying device having only one row of upper rollers located on the back of the sheet of substrate.

In the case where several upper and/or lower and/or additional upper rollers have an adjustable position, with motorized setup and real-time control, the device according to the invention also comprises synchronization means in order to synchronize the movements of all the rollers.

In the following, we will explain how using embodiments of the device according to the invention may ensure the stability of the sheet of substrate while it is being conveyed by limiting and/or compensating expected deformations of the sheet of substrate.

As examples, the following thermo-mechanical deformations will be taken into account:

mechanical deformation of the leading edge 15 of the sheet of substrate 10 occurring while this leading edge 15 is conveyed between two adjacent upper rotation axes 31 and therefore not in contact with any upper roller 30A; 30B, and thermal deformation due to the environmental conditions of the conveying device, for example used in a vacuum chamber of a sputtering device.

According to the invention, embodiments of the conveying device described above may be used to implement a method for conveying a sheet of substrate, wherein the position of each upper rotation axis 31 is moved away from the reception plane RP of the sheet of substrate 10 when said sheet of substrate first arrives close to contacting the lateral surface of revolution 32A; 32B of the upper rollers 30A; 30B supported by this upper rotation axis 31.

Other embodiments of the conveying device described above may be used to implement a method for conveying a sheet of substrate 10 wherein the position of each lower roller 20B along its lower rotation axis 21 and/or the position of each upper rotation axis 31 relative to the reception plane RP is adjusted in real time to limit deformation of the sheet of substrate 10 located near the leading edge 15 of the sheet of substrate 10 first conveyed in said device 1 and/or to limit deformation of the sheet of substrate 10 linked to thermal or mechanical stress applied to the sheet of substrate while it is being conveyed.

Figure 5:
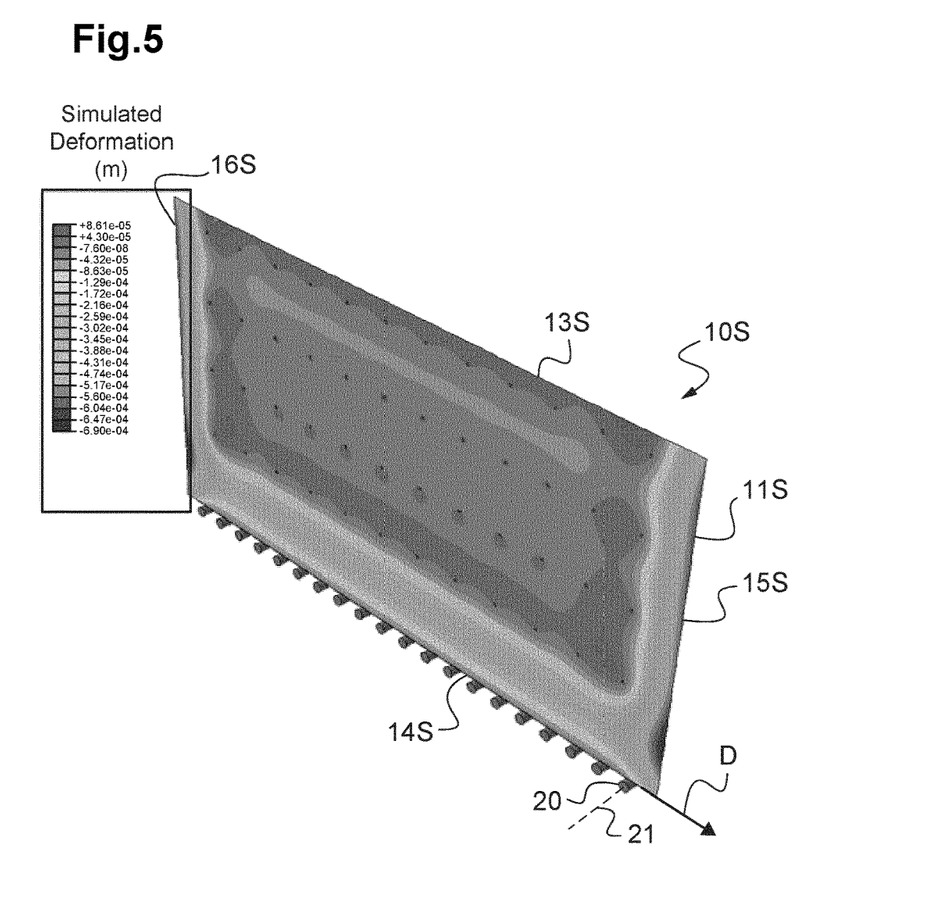
FIG. 5 is a contour map showing simulated amplitude levels (scale in meters) of the bending of a sheet of glass 6 meters long, 3.2 meters high and 2.1 millimeters thick, placed in an embodiment of the conveying device according to the invention, comprising here four rows of twelve upper rollers parallel to the conveying direction.
Figure 7:
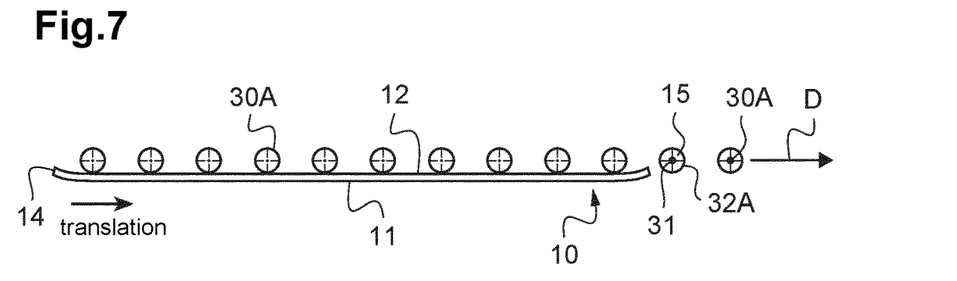
FIG. 7 is a schematic top view of an embodiment of the conveying device according to the invention illustrating one of the possible effects of thermos-mechanical deformation of the sheet of substrate during conveying.
Figure 8:
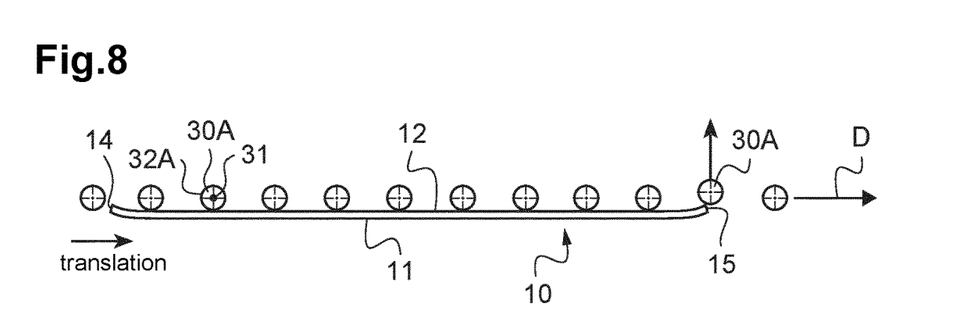
FIG. 8 is a schematic view similar to FIG. 7, illustrating a step of a method of conveying the sheet of substrate using this conveying device.

The deformations of the leading edge 15 of the sheet of substrate 10 occurring while this leading edge 15 is conveyed between two adjacent upper rotation axis 31 is represented schematically on FIG. 7 and simulated on FIG. 5.

When the sheet of substrate 10 goes from the upper rollers 30A of one upper rotation axis 31 to the upper rollers 30A of the next upper rotation axis 31, its leading edge 15 is temporary not supported and sag under its own weight due to gravity as illustrated by FIGS. 5 and 7.

FIG. 5 is a contour map showing the out-of-plane displacements of a 2.1 millimeters thick standard size simulated sheet of glass 10S supported by four rows of twelve upper rollers. The simulated sheet of glass 10S has a simulated leading edge 15S, a simulated closing edge 16S, a simulated top edge 13S and a simulated bottom edge 14S, as well as simulated front face 11S and back face.

Figure 6:
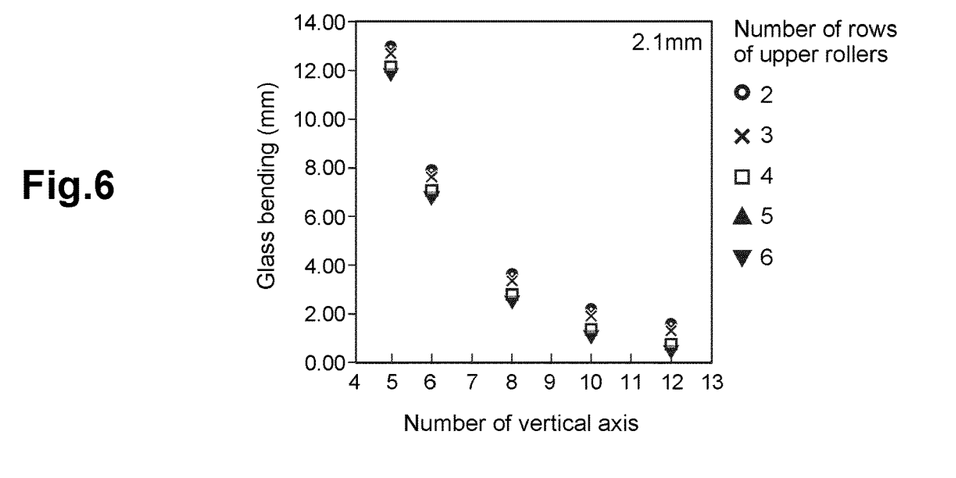
FIG. 6 is a graph showing simulated amplitude in millimeter of the bending of a sheet of glass 6 meters long, 3.2 meters high and 2.1 millimeters thick, placed in an embodiment of the conveying device according to the invention, comprising here two rows (round symbols), three rows (cross symbols), four rows (square symbols), five rows (up triangle symbols) or six rows (down triangle symbols) of upper rollers parallel to the conveying direction, as a function of the number of upper rollers per row used.

The simulated deformations increase with decreasing number of upper rotation axis 31 as the unsupported part of the sheet of substrate 10 gets longer. This is highlighted by the simulation results represented on FIG. 6. Regardless of the number of rows of upper rollers, the leading edge deformation is more than ten times higher with five upper rotation axes, corresponding to an unsupported length of about one meter between two adjacent upper rotation axes, as compared to the deformation simulated with twelve upper rotation axes, corresponding to an unsupported length of about 46 centimeters between two adjacent upper rotation axes.

As shown on this FIG. 7, if this deformation is not limited or compensated, the leading edge 15 of the sheet of substrate may collide into the upper rollers 30A of the next upper rotation axis 31, which may damage the sheet of substrate 10. It may also cause vibrations and instabilities.

A first possibility to remove this risk is to use an embodiment of the device 1 according to the invention wherein the distance between the reception plane RP and each upper rotation axis 31 is adjustable.

Only a small amplitude of movement is necessary to remove the upper rollers from the trajectory of the leading edge 15. For example, a backwards movement of about 4 millimeters, in the example of FIG. 7, is sufficient.

The movement of each upper rotation axis 31 is then synchronized with the advance of the sheet of substrate 10 along the conveying direction D. As shown on FIG. 8, each upper rotation axis 31 is moved away from the reception plane as the leading edge 15 of the sheet of substrate 10 arrives near the lateral surface 32A of the upper rollers 30A of this upper rotation axis 31.

Figure 9:
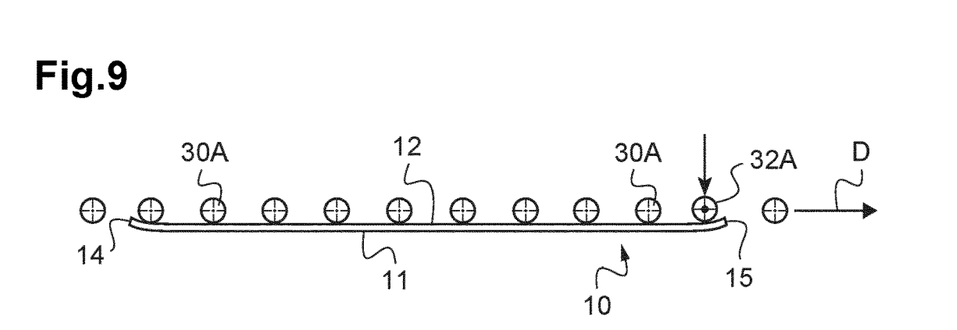
FIG. 9 is a schematic view similar to FIG. 7, illustrating a further step of the method of conveying the sheet of substrate using this conveying device.

When the leading edge has passed in front of the upper rotation axis 31, the upper rotation axis 31 retrieves its initial position and the upper rollers softy contact the back face 11 of the sheet of substrate 10 (FIG. 9).

A second possibility to remove this risk is to use an embodiment of the device 1 according to the invention wherein the lateral surface of each upper roller 30A is deformable to smoothly absorb leading deformations or able to buckle away from the reception plane when initially contacted by the leading edge and retrieve its initial shape far from the leading edge.

A third possibility to remove this risk is to use an embodiment of the device 1 according to the invention wherein the diameters of the upper rollers mounted on the same upper rotation axis are different, in order to impose a specific shape to the sheet of substrate that will make it more rigid in longitudinal direction and limit leading edge 15 bending.

In other words, the deformation of the leading edge 15 is limited by imposing a controlled transverse deformation, along the close-to-vertical direction of the leading edge 15 of the sheet of substrate 10 that will rigidify the sheet of substrate longitudinally, in the conveying direction D, and therefore limit longitudinal deformations such as leading edge bending.

This shape can be imposed by moving upper rollers of one or several rows away from the reception plane RP, in the case where the upper rollers supported by an upper rotation axis can be moved independently from each other.

The upper rollers positions are then fixed during conveying.

Alternatively, upper rollers with different diameters can be used.

Figure 10:
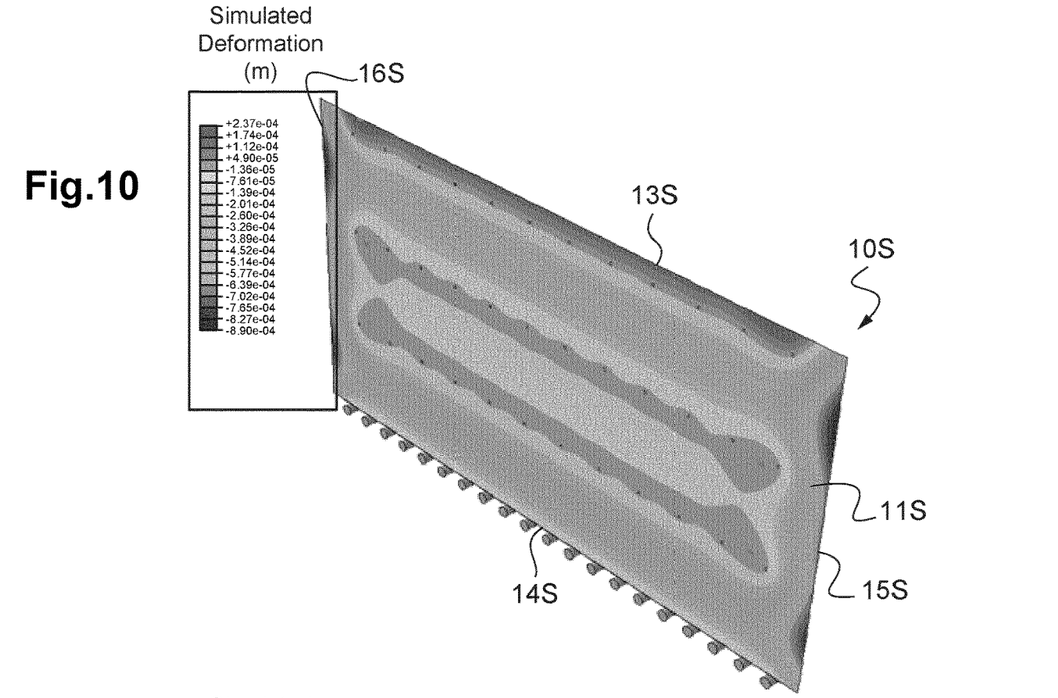
FIG. 10 is a contour map showing simulated amplitude levels (scale in meters) of the bending of a sheet of glass 6 meters long, 3.2 meters high and 2.1 millimeters thick, placed in an embodiment of the conveying device according to the invention, comprising here three rows of twelve upper rollers parallel to the conveying direction, wherein the contact surfaces between each upper roller and the corresponding main face of the sheet of substrate are all in the same plane.
Figure 11:
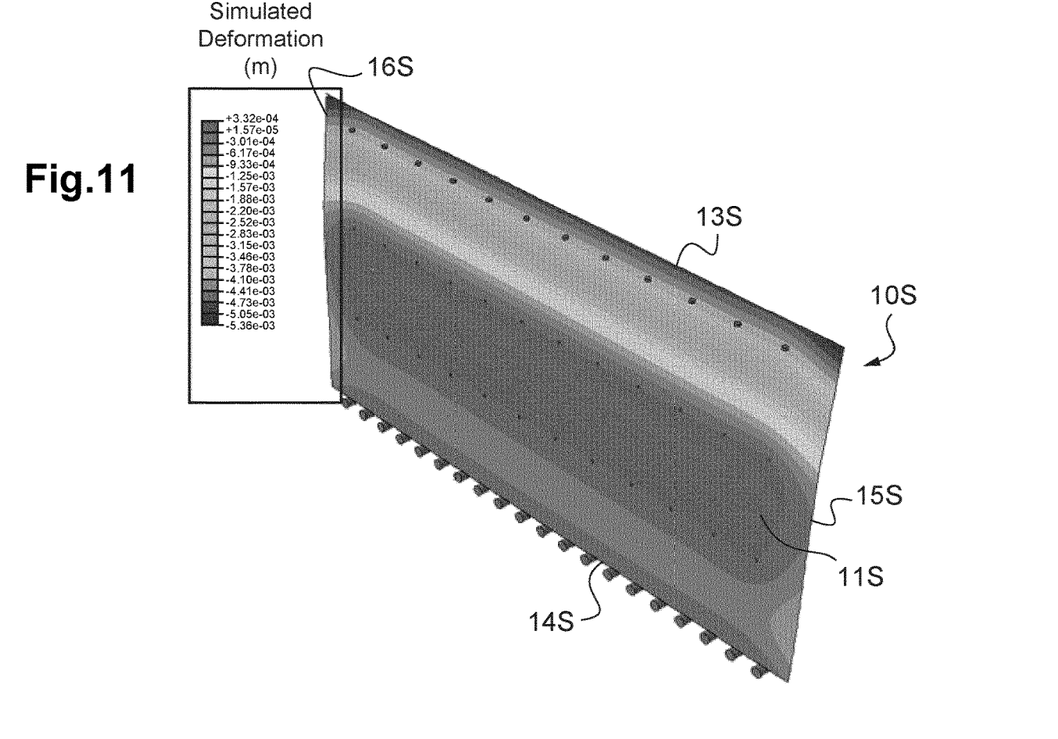
FIG. 11 is a contour map similar to the contour map of FIG. 10, except that another embodiment of the conveying device is used for the simulation, wherein the top row of upper rollers are moved away by 4 millimeters from the plane defined by the contact surfaces between the two lower rows of upper rollers and the sheet of substrate.

As an example of this last possibility, FIGS. 10 and 11 show the contour maps of the out-of-plane displacements of the simulated sheet of glass 10S of thickness 2.1 millimeter with standard size supported by embodiments of the device having three rows of twelve upper rollers of same diameters according to the features of table 1 for FIG. 10, and a similar device with upper rollers having different diameters causing a backwards translation of 4 millimeters of the zone of contact between the lateral surface of the upper rollers of the top row and the simulated back face 12S of the sheet of glass 10S in FIG. 11.

A transverse convex shape is therefore imposed to the simulated sheet of glass 10S by moving the lateral surface of the upper rollers of the top row 4 millimeters away from the reception plane.

The map of FIG. 10 show that the largest deformations of the simulated sheet of glass 10S are located near the simulated leading edge 15S and simulated closing edge 16S.

As visible on FIG. 11, the largest deformation of the simulated sheet of glass 10S are then located along the simulated top edge 13S of the simulated sheet of glass 10S.

Figure 12:
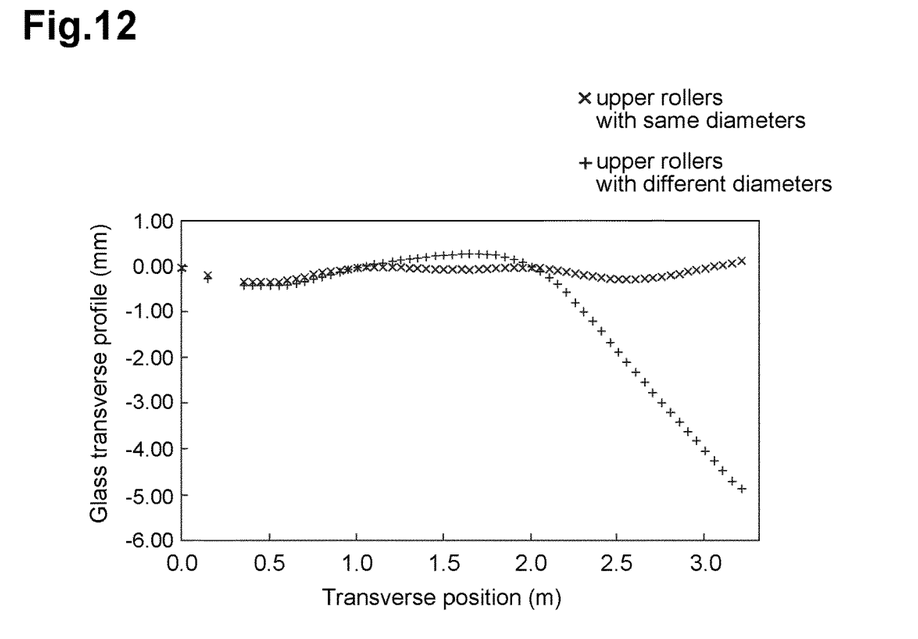
FIG. 12 is a graph showing the position of the simulated sheets of substrate represented on the contour map of FIGS. 10 and 11, along a central transverse (vertical) section of the simulated sheets.
Figure 13:
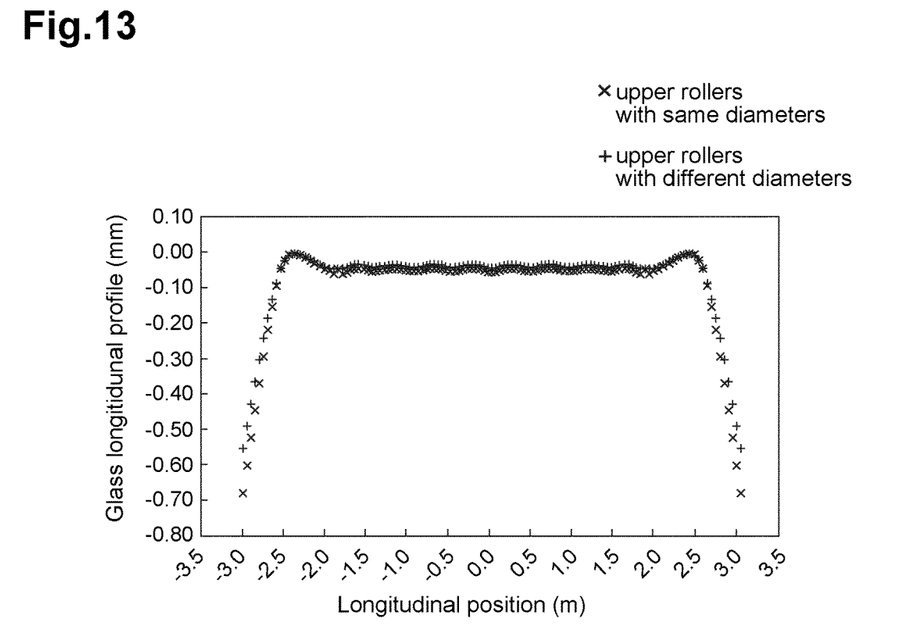
FIG. 13 is a graph showing the position of the simulated sheets of substrate represented on the contour map of FIGS. 10 and 11, along a longitudinal (horizontal) section of the simulated sheets, along the top row of upper rollers (height=3 meters)

Corresponding profiles extracted from these simulations are shown of FIGS. 12 and 13.

FIG. 12 shows the transverse (vertical) profile of the back face of the simulated sheets of glass of FIGS. 10 (× symbols) and 11 (+ symbols) at the middle of the length of the simulated sheet of glass. This figure shows the deformation of the simulated sheet of glass imposed by moving the lateral surface of the upper rollers away from the reception plane. The simulated top edge 13S of the simulated sheet of glass 10S is displaced by 5 millimeters backwards from the reception plane. The reception plane corresponds to the plane with zero deformation.

FIG. 13 shows the longitudinal (horizontal) profile of the back face of the simulated sheets of glass of FIGS. 10 (× symbols) and 11 (+ symbols) at the height of the top row of upper rollers (3 meters). The position of the simulated leading edge 15S is shown by the last symbol placed at longitudinal position of 3 meters, the middle of the simulated sheet being placed a zero.

This figure shows that bending of the simulated leading edge 15S is reduced by 18.6%. The simulated leading edge bendings determined at different heights corresponding to the heights of the upper roller rows show reductions between 1.4 and 18.6%.

Other shapes imposed to the sheet of substrate can of course be considered within the scope of the invention, for example corrugated, convex with different row heights, concave.

Regarding the thermal deformation, the sputtering process for example generates fast and high heating of the treated surface as the sheet of glass moves in front of the cathodes of the sputtering device. Resulting thermal gradients appearing through the glass thickness can cause deformations and out-of-plane displacements towards the cathodes of several centimeters. This may bring the treated surface too close to the deposition system and affect coating homogeneity. Again, large displacements can also impact glass stability.

Thanks to the device according to the invention, thermal deformations are at least partly compensated by imposing a concave transverse shape to the sheet of glass. This concave shape is for example imposed by mounting upper rollers 30B with a smaller diameter on the central rows of upper rollers 30B and by adjusting their heights and number to increase the effect, as represented on FIG. 14.

An embodiment of such a conveying device has the features listed in tables 2 and 3.

TABLE 2

| Number of rows of upper rollers | Total number of upper rollers | Top row height in meters | Distance between rows in meter |
|---|---|---|---|
| 5 | 60 | 3.15 | 0.77 |

TABLE 3

| Row number | Roller diameter in millimeters | Resulting row shift in millimeters |
|---|---|---|
| 1 | 70 | 0 |
| 2 | 32 | 19 |
| 3 | 22 | 24 |
| 4 | 32 | 19 |
| 5 | 70 | 0 |

FIG. 15 shows the simulated out-of-plane displacements of a 2.1 mm thick standard size simulated sheet of glass with the conveying device having the features of Tables 2 and 3. In the perspective view deformations are magnified by a factor 20 to make obtained concave shape more visible.

This curved shape will also have the same rigidifying effect as discussed above, thus limiting leading edge collisions with upper rollers.

In this example, deflection at the center of the simulated sheet of glass is around 25 millimeters.

In practice, to prevent glass breakage, local radius of curvature imposed to the sheet of glass should not exceed about 3.5 m to keep bending stresses below 20 MPa.

Glass curvature, either imposed by the conveying device or coming from thermo-mechanical deformations, have to be kept below this limit by choosing adapted settings.

In addition, out-of-plane displacements during sputtering process coming from the combined effects of the conveying device and thermo-mechanical deformations should not exceed 30-40 millimeters to ensure deposited thin film homogeneity.

The device 1 and methods according to the invention allow controlling the shape of the conveyed sheet of substrate. Imposing a convex shape in transverse, longitudinal or a combination of both directions will rigidify the sheet of substrate and limit deformations. It also allows compensating thermal deformations, keep the sheet of substrate stable and in a position adapted to processing, for example ensuring homogeneity of the coating.

The methods according to the invention are computer-implemented. The invention therefore also related to a computer program product, comprising program code instructions for implementing the methods described above, when said program is executed on a computer or a processor.

It also relates to a non-transitory computer-readable medium comprising a computer program product recorded thereon and capable of being run by a processor, including program code instructions for implementing said methods.

For example, said computer program product may use a wide range of substrate deformation simulation results stored in a database. Said computer program product continuously provides the optimized settings of the device to apply depending on currently transported sheet of substrate thickness, environmental parameters such as cathodes power in sputtering processes and/or inputs from displacement sensors or thermocouples.

The different embodiments described here are part of the invention considered independently or with all combination technically possible.

What is claimed is:

1. A device for conveying a sheet of substrate having two opposed main faces linked by an edge face, wherein one of said two main faces of the sheet of substrate is positioned along a reception plane of said device, an inclination angle of said reception plane relative to a vertical plane being between 1 and 15 degrees, the device comprising:
  a plurality of lower rollers positioned side by side along a conveying direction, each of the plurality of lower rollers being able to rotate about a lower rotation axis extending perpendicularly to the conveying direction in a conveying plane and being arranged to receive a part of the edge face of the sheet of substrate,
  a plurality of upper rollers, each of the plurality of upper rollers being arranged to receive one of said two main faces of the sheet of substrate and being able to rotate about an upper rotation axis orthogonal to said conveying direction,
  wherein said plurality of upper rollers comprises upper rollers positioned at different heights from said conveying plane,
  wherein each upper roller comprises a lateral surface of revolution for contacting said main face of the sheet of substrate, and said lateral surface of revolution is adapted to be moved away from said reception plane, and wherein said lateral surface of revolution is adapted to be deformed away from said reception plane.

2. A method for conveying a sheet of substrate comprising using a device according to claim 1, wherein the position of each lower roller along its lower rotation axis and/or the position of each upper rotation axis relative to the reception plane is adjusted in real time to limit deformation of the sheet of substrate located near the edge of the sheet of substrate first conveyed in said device and/or to limit deformation of the sheet of substrate linked to thermal or mechanical stress applied to the sheet of substrate while the sheet of substrate is being conveyed.

3. A deposition system comprising a device according to claim 1, the deposition system being adapted for depositing an electrochromic stack on the sheet of substrate.

4. A method of depositing an electrochromic stack, the method comprising implementing the deposition system according to claim 3.

5. A method for conveying a sheet of substrate, comprising using a device for conveying a sheet of substrate having two opposed main faces linked by an edge face, wherein one of said two main faces of the sheet of substrate is positioned along a reception plane of said device, an inclination angle of said reception plane relative to a vertical plane being between 1 and 15 degrees, wherein the device includes:
a plurality of lower rollers positioned side by side along a conveying direction, each of the plurality of lower rollers being able to rotate about a lower rotation axis extending perpendicularly to the conveying direction in a conveying plane and being arranged to receive a part of the edge face of the sheet of substrate, a plurality of upper rollers, each of the plurality of upper rollers being arranged to receive one of said two main faces of the sheet of substrate and being able to rotate about an upper rotation axis orthogonal to said conveying direction, wherein said plurality of upper rollers comprises upper rollers positioned at different heights from said conveying plane, wherein the position of each upper rotation axis is moved away from the reception plane of the sheet of substrate when said sheet of substrate first arrives close to contacting the lateral surface of revolution of the upper rollers supported by said upper rotation axis.

6. A non-transitory computer-readable medium comprising a computer program product recorded thereon and capable of being run by a processor, including program code instructions for implementing the method according to claim 4.

7. A device for conveying a sheet of substrate having two opposed main faces linked by an edge face, wherein one of said two main faces of the sheet of substrate is positioned along a reception plane of said device, an inclination angle of said reception plane relative to a vertical plane being between 1 and 15 degrees, the device comprising:
a plurality of lower rollers positioned side by side along a conveying direction, each of the plurality of lower rollers being able to rotate about a lower rotation axis extending perpendicularly to a conveying direction in a conveying plane and being arranged to receive a part of the edge face of the sheet of substrate,
a plurality of upper rollers, each of the plurality of upper rollers being arranged to receive one of said two main faces of the sheet of substrate and being able to rotate about an upper rotation axis orthogonal to said conveying direction,
wherein said plurality of upper rollers comprises upper rollers positioned at different heights from said conveying plane, and
wherein the upper rollers supported by a shared upper rotation axis have different diameters.

8. The device according to claim 7, wherein the diameter of each upper roller is determined taking into account an expected deformation of the sheet of substrate while the sheet of substrate is conveyed on the device.

9. The device according to claim 8, wherein the diameter of each upper roller is determined to limit deformation of the sheet of substrate located near the edge of the sheet of substrate first conveyed in said device and/or to limit deformation of the sheet of substrate linked to thermal or mechanical stress applied to the sheet of substrate while the sheet of substrate is being conveyed.

10. A device for conveying a sheet of substrate having two opposed main faces linked by an edge face, wherein one of said two main faces of the sheet of substrate is positioned along a reception plane of said device, an inclination angle of said reception plane relative to a vertical plane being between 1 and 15 degrees, the device comprising:
a plurality of lower rollers positioned side by side along a conveying direction, each of the plurality of lower rollers being able to rotate about a lower rotation axis extending perpendicularly to the conveying direction in a conveying plane and being arranged to receive a part of the edge face of the sheet of substrate,
a plurality of upper rollers, each of the plurality of upper rollers being arranged to receive one of said two main faces of the sheet of substrate and being able to rotate about an upper rotation axis orthogonal to said conveying direction,
wherein said plurality of upper rollers comprises upper rollers positioned at different heights from said conveying plane, and
wherein each lower roller comprises a lateral surface of revolution for contacting the edge face of the sheet of substrate presenting a concave shape and is movable along its lower rotation axis.

11. The device according to claim 10, wherein the position of the lower roller along its lower rotation axis is determined to limit deformation of the sheet of substrate located near the edge of the sheet of substrate first conveyed in said device and/or to limit deformation of the sheet of substrate linked to thermal or mechanical stress applied to the sheet of substrate while it is being conveyed.

12. A non-transitory computer-readable medium comprising a computer program product recorded thereon and capable of being run by a processor, including program code instructions for implementing the method according to claim 5.

13. The method according to claim 5, wherein said upper rotation axis supports at least two upper rollers.

14. The method according to claim 5, wherein a position of each upper roller along the upper rotation axis is adjustable and/or a number of upper rollers supported by each upper rotation axis is adjustable.

15. The device according to claim 14, wherein said position of each upper roller on its upper rotation axis is predetermined or adjusted in real time during conveying the sheet of substrate.

16. The method according to claim 5, wherein each upper roller comprises a lateral surface of revolution for contacting said main face of the sheet of substrate, and said lateral surface of revolution is adapted to be moved away from said reception plane.

17. The device according to claim 16, wherein said lateral surface of revolution is adapted to be deformed away from said reception plane.

18. The method according to claim 5, wherein the upper rotation axis is adapted to be moved away from and/or towards said reception plane.

19. The method according to claim 5, wherein said upper rotation axis is adapted to be moved away from or towards said reception plane to a predetermined set position or in real time during conveying the sheet of substrate.

20. The method according to claim 12, wherein additional opposed upper rollers are positioned to contact the other main face of the sheet of substrate.

21. The method according to claim 5, wherein the upper rollers supported by a shared upper rotation axis have different diameters.

22. The method according to claim 21, wherein the diameter of each upper roller is determined taking into account an expected deformation of the sheet of substrate while the sheet of substrate is conveyed on the device.

23. The method according to claim 22, wherein the diameter of each upper roller is determined to limit deformation of the sheet of substrate located near the edge of the sheet of substrate first conveyed in said device and/or to limit deformation of the sheet of substrate linked to thermal or mechanical stress applied to the sheet of substrate while the sheet of substrate is being conveyed.

24. The method according to claim 5, wherein each lower roller comprises a lateral surface of revolution for contacting the edge face of the sheet of substrate presenting a concave shape and is movale along its lower rotation axis.

25. The method according to claim 24, wherein the position of the lower roller along its lower rotation axis is determined to limit deformation of the sheet of substrate located near the edge of the sheet of substrate first conveyed in said device and/or to limit deformation of the sheet of substrate linked to thermal or mechanical stress applied to the sheet of substrate while it is being conveyed.

* * * * *